(12) United States Patent
Choi et al.

(10) Patent No.: US 12,484,200 B2
(45) Date of Patent: Nov. 25, 2025

(54) SYSTEMS AND METHODS FOR COOLING MODULE WITH PROGRESSIVE COOLING FINS

(71) Applicant: BorgWarner US Technologies LLC, Wilmington, DE (US)

(72) Inventors: Edward Choi, Lake Orion, MI (US); Todd George Nakanishi, Cicero, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 265 days.

(21) Appl. No.: 18/187,894

(22) Filed: Mar. 22, 2023

(65) Prior Publication Data

US 2024/0324150 A1    Sep. 26, 2024

(51) Int. Cl.
*H05K 7/20* (2006.01)
*B60L 50/51* (2019.01)
*F28F 13/06* (2006.01)

(52) U.S. Cl.
CPC .............. *H05K 7/209* (2013.01); *B60L 50/51* (2019.02); *F28F 13/06* (2013.01); *H05K 7/20845* (2013.01); *B60L 2210/40* (2013.01)

(58) Field of Classification Search
CPC ........... H05K 7/20872; H05K 7/20854; H05K 7/209; H05K 7/20927; B60L 50/51; B60L 2210/40; F28F 13/06
See application file for complete search history.

(56) References Cited

U.S. PATENT DOCUMENTS

| | | | |
|---|---|---|---|
| 8,081,465 B2 * | 12/2011 | Nishiura | H01L 23/3735 361/689 |
| 10,744,603 B2 | 8/2020 | Machler et al. | |
| 11,168,949 B2 * | 11/2021 | Carney | F28F 3/027 |
| 11,502,349 B2 | 11/2022 | Choi et al. | |
| 2010/0172091 A1 | 7/2010 | Nishiura | |
| 2013/0068434 A1 * | 3/2013 | Takano | F28F 3/025 165/170 |
| 2021/0280498 A1 * | 9/2021 | Kang | H01L 25/117 |
| 2022/0120518 A1 * | 4/2022 | Vanderwees | H05K 7/20254 |
| 2024/0118042 A1 * | 4/2024 | Hermida | H01L 23/473 |
| 2024/0121913 A1 * | 4/2024 | Hsiung | H05K 7/2039 |
| 2024/0138107 A1 * | 4/2024 | Liang | H05K 7/20272 |

FOREIGN PATENT DOCUMENTS

JP     2019020108    2/2019

* cited by examiner

Primary Examiner — Jayprakash N Gandhi
Assistant Examiner — Matthew Sinclair Muir
(74) Attorney, Agent, or Firm — Joshua M. Haines; Bookoff McAndrews, PLLC

(57) ABSTRACT

A heat sink system includes: a container including a cavity; a housing connecting to the container to cover the cavity, wherein one or more of the container or the housing includes an inlet port, and one or more of the container or the housing includes an outlet port; and a cooling module in the cavity between the container and the housing, the cooling module in a flow of coolant from the inlet port to the outlet port, wherein the cooling module includes: first cooling fins with a first cooling fin geometry, and second cooling fins with a second cooling fin geometry, wherein the first cooling fins are upstream of the second cooling fins along the flow of coolant from the inlet port to the outlet port.

14 Claims, 7 Drawing Sheets

SYSTEMS AND METHODS FOR COOLING MODULE WITH PROGRESSIVE COOLING FINS

STATEMENT REGARDING FEDERALLY SPONSORED RESEARCH OR DEVELOPMENT

This invention was made with government support under contract DEEE0009653 awarded by the United States Department of Energy. The government has certain rights in the invention.

TECHNICAL FIELD

Various embodiments of the present disclosure relate generally a cooling module, and more specifically, to systems for providing thermal management and progressive cooling fins on a cooling module to, e.g., facilitate reducing the temperature in a power module.

INTRODUCTION

Thermal management is considered a key technical aspect in an electric vehicle system. A cooling module may therefore be a critical component in a traction inverter system, which controls the performance and efficiency of an overall driving system of an electric vehicle. However, some cooling modules may have limited capability for thermal performance optimization and may have high pressure drop.

The present disclosure is directed to overcoming one or more of these above referenced challenges.

SUMMARY OF THE DISCLOSURE

In some aspects, the techniques described herein relate to a heat sink system including: a container including a cavity; a housing connecting to the container to cover the cavity, wherein one or more of the container or the housing includes an inlet port, and one or more of the container or the housing includes an outlet port; and a cooling module in the cavity between the container and the housing, the cooling module in a flow of coolant from the inlet port to the outlet port, wherein the cooling module includes: first cooling fins with a first cooling fin geometry, and second cooling fins with a second cooling fin geometry, wherein the first cooling fins are upstream of the second cooling fins along the flow of coolant from the inlet port to the outlet port.

In some aspects, the techniques described herein relate to a heat sink system, wherein the first cooling fin geometry is a first sinusoidal wave having a first uniform wavelength, and the second cooling fin geometry is a second sinusoidal wave having a second uniform wavelength that is shorter than the first uniform wavelength.

In some aspects, the techniques described herein relate to a heat sink system, wherein: the cooling module further includes third cooling fins with a third cooling fin geometry, the second cooling fins are upstream of the third cooling fins along the flow of coolant from the inlet port to the outlet port, and the third cooling fin geometry is a third sinusoidal wave having a third uniform wavelength that is shorter than the second uniform wavelength.

In some aspects, the techniques described herein relate to a heat sink system, wherein a downstream end of the first cooling fins is connected to an upstream end of the second cooling fins.

In some aspects, the techniques described herein relate to a heat sink system, wherein the cooling module further includes a first transition zone between the first cooling fins and the second cooling fins.

In some aspects, the techniques described herein relate to a heat sink system, wherein the first transition zone does not include cooling fins.

In some aspects, the techniques described herein relate to a heat sink system, wherein: the first transition zone includes first transition cooling fins with a first transition cooling fin geometry, a downstream end of the first cooling fins is connected to an upstream end of the first transition cooling fins, and a downstream end of the first transition cooling fins is connected to an upstream end of the second cooling fins.

In some aspects, the techniques described herein relate to a heat sink system, wherein the first transition cooling fin geometry is a first sinusoidal wave having a first uniform wavelength.

In some aspects, the techniques described herein relate to a heat sink system, wherein: the cooling module further includes third cooling fins with a third cooling fin geometry, wherein the second cooling fins are upstream of the third cooling fins along the flow of coolant from the inlet port to the outlet port, the cooling module further includes a second transition zone between the second cooling fins and the third cooling fins, wherein the second transition zone includes second transition cooling fins with a second transition cooling fin geometry, and the second transition cooling fin geometry is a second sinusoidal wave having a second uniform wavelength that is shorter than the first uniform wavelength.

In some aspects, the techniques described herein relate to an inverter including the heat sink system.

In some aspects, the techniques described herein relate to a vehicle including the inverter.

In some aspects, the techniques described herein relate to a cooling module including: first cooling fins with a first cooling fin geometry, and second cooling fins with a second cooling fin geometry, wherein the first cooling fin geometry is a first sinusoidal wave having a first uniform wavelength, and the second cooling fin geometry is a second sinusoidal wave having a second uniform wavelength that is shorter than the first uniform wavelength.

In some aspects, the techniques described herein relate to a cooling module, wherein: the cooling module further includes third cooling fins with a third cooling fin geometry, the second cooling fins are between the first cooling fins and the third cooling fins, and the third cooling fin geometry is a third sinusoidal wave having a third uniform wavelength that is shorter than the second uniform wavelength.

In some aspects, the techniques described herein relate to a cooling module, wherein an end of the first cooling fins is connected to an end of the second cooling fins.

In some aspects, the techniques described herein relate to a cooling module, wherein: the cooling module further includes a first transition zone between the first cooling fins and the second cooling fins, and the first transition zone includes first transition cooling fins with a first transition cooling fin geometry.

In some aspects, the techniques described herein relate to a cooling module, wherein the first transition cooling fin geometry is a flat wave having an infinite wavelength.

In some aspects, the techniques described herein relate to a cooling module, wherein the first transition cooling fins are inclined at an angle from approximately 5 degrees to approximately 45 degrees relative to a longitudinal axis of the cooling module.

In some aspects, the techniques described herein relate to a system including: an inverter configured to convert DC power from a battery to AC power to drive a motor, wherein the inverter includes: a power module; and a heat sink system configured to cool the power module, the heat sink system including: a container including a cavity; a housing connecting to the container to cover the cavity, wherein one or more of the container or the housing includes an inlet port, and one or more of the container or the housing includes an outlet port; and a cooling module in the cavity between the container and the housing, the cooling module in a flow of coolant from the inlet port to the outlet port, wherein the cooling module includes: first cooling fins with a first cooling fin geometry, and second cooling fins with a second cooling fin geometry, wherein the first cooling fins are upstream of the second cooling fins along the flow of coolant from the inlet port to the outlet port.

In some aspects, the techniques described herein relate to a system, wherein the first cooling fin geometry is a first sinusoidal wave having a first uniform wavelength, and the second cooling fin geometry is a second sinusoidal wave having a second uniform wavelength that is shorter than the first uniform wavelength.

In some aspects, the techniques described herein relate to a system, further including: the battery configured to supply the DC power to the inverter; and the motor configured to receive the AC power from the inverter to drive the motor.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
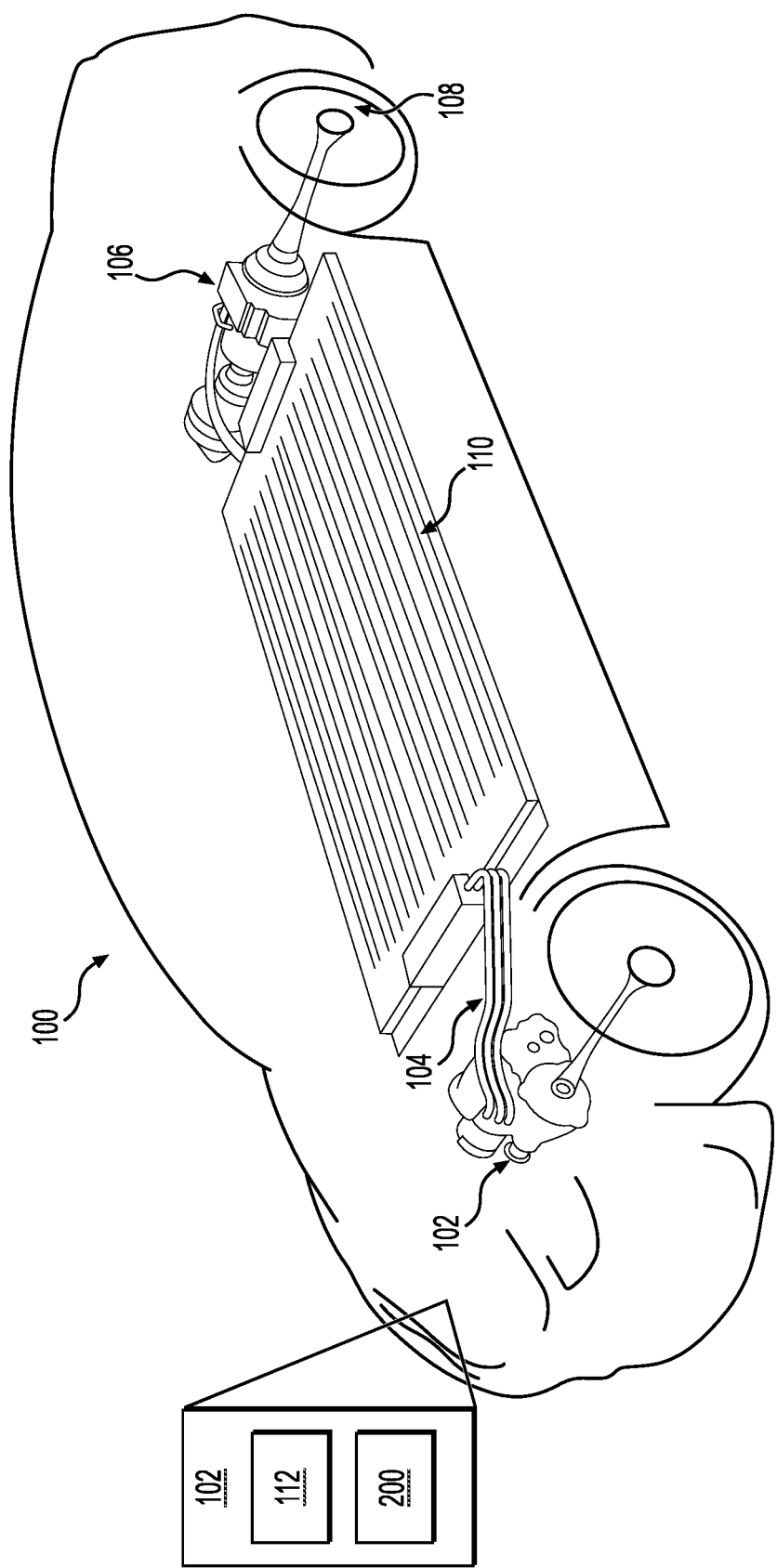
FIG. 1 depicts an exemplary system infrastructure for a vehicle including a traction inverter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the power module may be described as a device, but may refer to any device for controlling the flow of power in an electrical circuit. For example, a power module may be a metal-oxide-semiconductor field-effect transistor (MOSFETs), bipolar junction transistor (BJTs), insulated-gate bipolar transistor (IGBTs), or relays, for example, or any combination thereof, but are not limited thereto.

Thermal management may be considered a key technical aspect in an electric vehicle system. A cooling module may therefore be a critical component in a traction inverter system, which controls the performance and efficiency of an overall driving system of an electric vehicle. However, some cooling modules may have limited capability for thermal performance optimization and may have high pressure drop. Some cooling modules with single-side or double-side cooled power modules may have power modules operating at high temperatures, may not provide a well-balanced thermal performance among power modules due to coolant heat-up effect along a coolant flow direction, and may not provide a low pressure drop due to the cooling fin design.

One or more embodiments may include progressive fins which may have progressively changing wavelength (waviness) of the fins in a flow direction of coolant. One or more embodiments may reduce pressure drop in an inverter, which may result in a parasitic loss reduction of a cooling system by reducing the energy consumption of the coolant pump. One or more embodiments may reduce the temperature of a power module, which may result in a higher performance or power density of the inverter, or a longer driving range of an electric vehicle. One or more embodiments may include progressive cooling fins that may provide uniform temperature among power modules, which may improve the performance and reliability of an electric vehicle.

FIG. 1 depicts an exemplary system infrastructure for a vehicle including a traction inverter, according to one or more embodiments. Electric vehicle 100 may include traction inverter 102, connectors 104, drive motor 106, wheels 108, and battery 110. Traction inverter 102 may include power module 112 and heat sink system 200. Heat sink system 200 may be used to cool power module 112. Connectors 104 may connect the traction inverter 102 and battery 110. Traction inverter 102 may include components to receive electrical power from an external source and output electrical power to charge battery 110 of electric vehicle 100. Traction inverter 102, through the use of a power module 112, may convert DC power from battery 110 in electric vehicle 100 to AC power, to power the drive motor 106 and wheels 108 of electric vehicle 100, for example, but the embodiments are not limited thereto. The traction inverter 102 may be bidirectional, and may convert DC power to AC power, or convert AC power to DC power, such as during regenerative braking, for example. Traction inverter 102 may be a single-phase inverter, or a multi-phase inverter, such as a three-phase inverter, for example.

Figure 2:
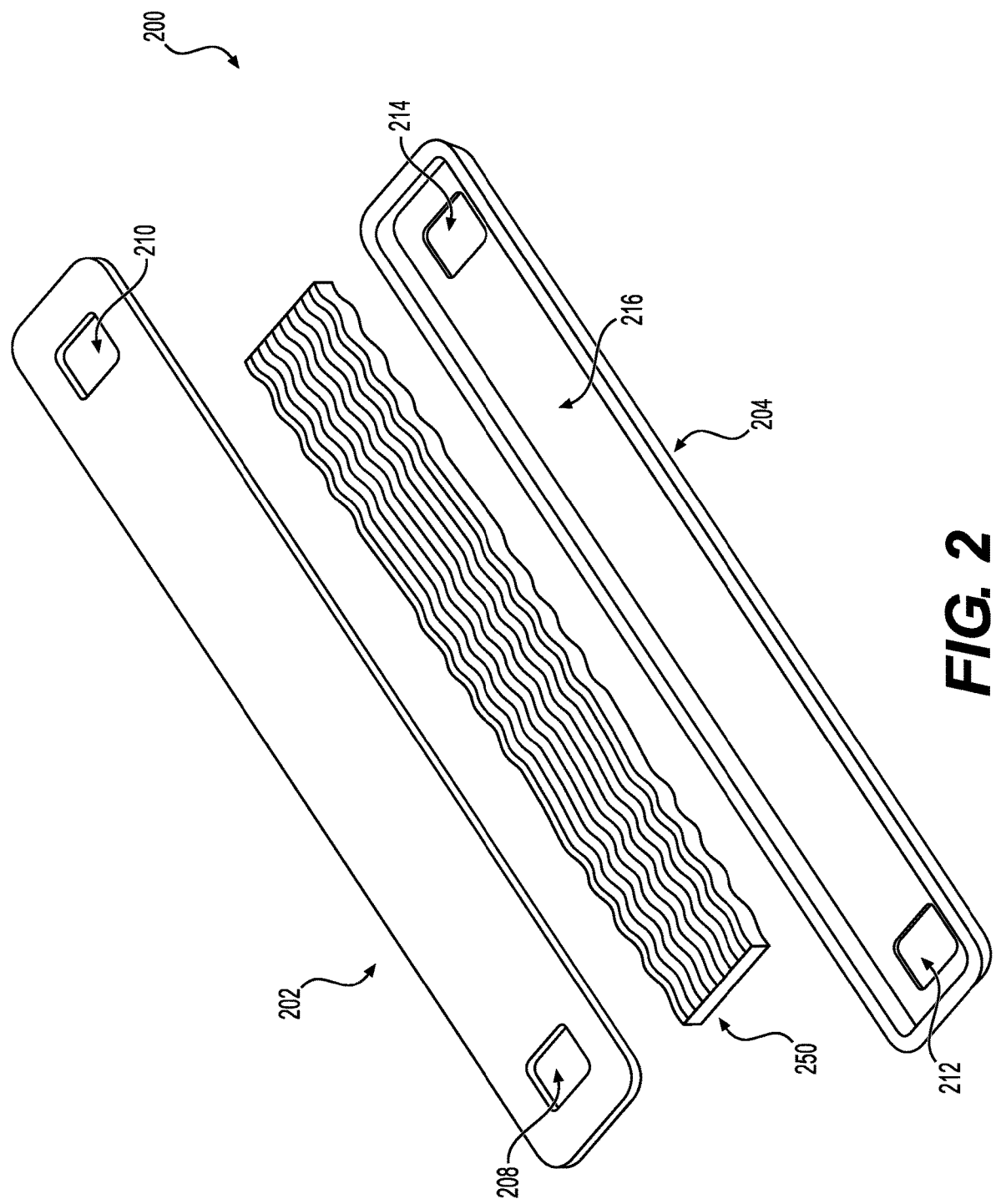
FIG. 2 depicts an exploded view of an exemplary heat sink system including a cooling module, according to one or more embodiments.

FIG. 2 depicts an exploded view of an exemplary heat sink system including a cooling module, according to one or more embodiments. Heat sink system 200 may include housing 202, container 204, and cooling module 250. Housing 202 may include inlet port 208 and outlet port 210. Container 204 may include inlet port 212, outlet port 214, and cavity 216.

Cooling module 250 may be located between housing 202 and container 204. Housing 202 may be in contact with cooling module 250. Container 204 may include cavity 216 where cooling module 250 may be in contact with container 204. Inlet port 208 of housing 202 may supply liquid coolant to cavity 216 and cooling module 250, and outlet port 210 of housing 202 may exhaust coolant from cavity 216 and cooling module 250. Inlet port 212 of container 204 may supply liquid coolant to cavity 216 and cooling module 250, and outlet port 214 of container 204 may exhaust coolant from cavity 216 and cooling module 250. Inlet port 208 of housing 202 or inlet port 212 of container 204 may function as an outlet port to a second cooling module (such as in a double-sided cooling arrangement, for example), or may be closed (such as in a single-sided cooling arrangement, for example).

Heat sink system 200 may provide thermal heat dissipation to power module 112 (see FIG. 1). The material of housing 202 and container 204 of heat sink system 200 may be selected based on the required thermal performance needed to draw heat away from power module 112. For example, housing 202 and container 204 of heat sink system 200 may include an aluminum alloy having a high thermal conductivity. Housing 202 and container 204 of heat sink system 200 may include copper. Heat sink system 200 may include a circulating fluid or gas therein. Heat sink system 200 may be provided in an extruded, folded fin, bonded fin, active fan, stamping, or cross-cut configuration.

Cooling module 250 may be a continuous, single-folded, metal sheet. Cooling module 250 may have a rectangular, circular, or curved geometry. Similar to housing 202 and container 204 of heat sink system 200, cooling module 250 may include an aluminum alloy having a high thermal conductivity while being mechanically soft. Cooling module 250 may include copper, or an alloy of copper and aluminum, for example.

Figure 3:
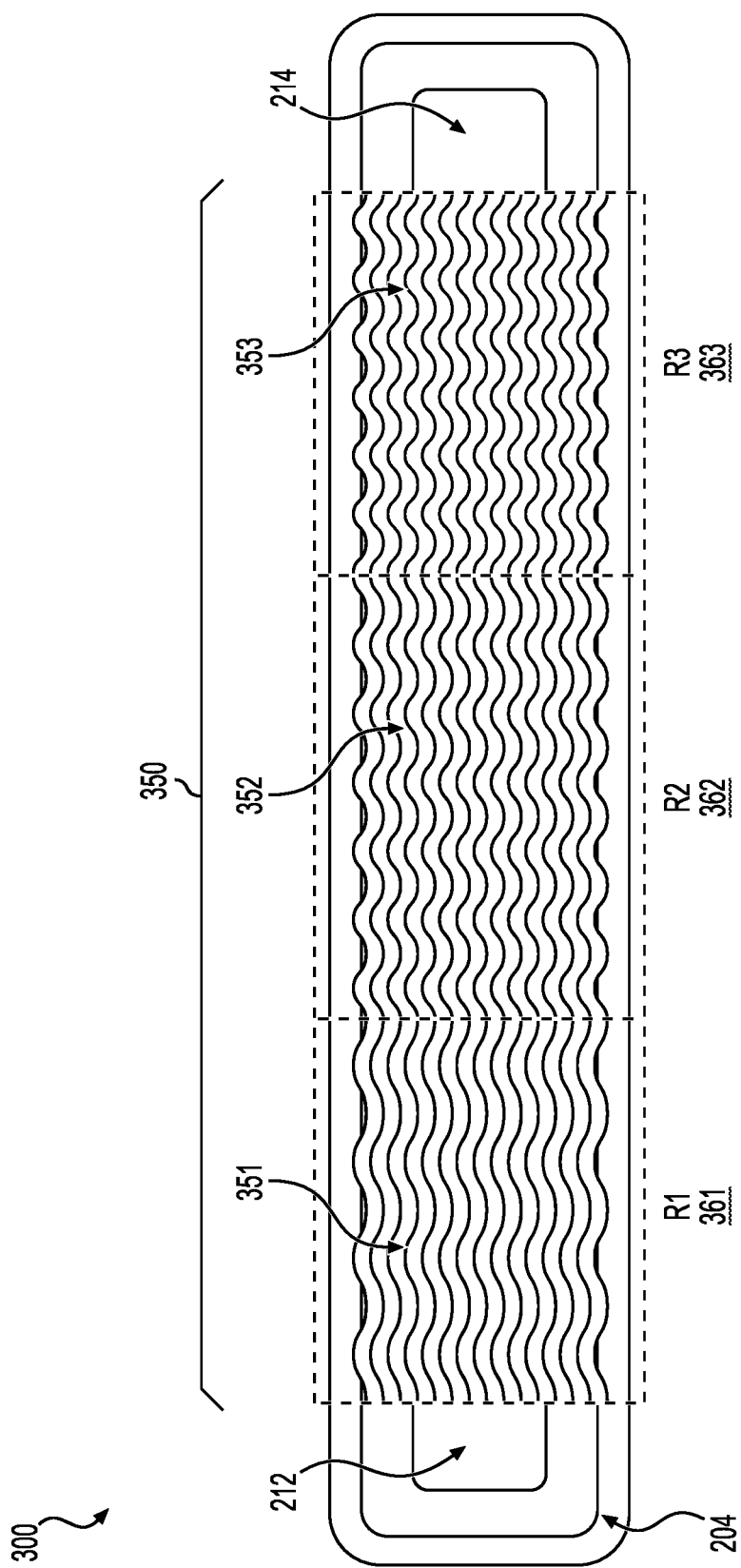
FIG. 3 depicts an exemplary heat sink system including a cooling module with cooling fins, according to one or more embodiments.

FIG. 3 depicts an exemplary heat sink system including a cooling module with cooling fins, according to one or more embodiments. Heat sink system 300 may include a cooling module 350 and container 204. Although not shown in FIG. 3, heat sink system 300 may include housing 202 (see FIG. 2). Container 204 may include inlet port 212 and outlet port 214. Cooling module 350 may include a plurality of cooling zones R1, R2, and R3. Along a flow direction from inlet port 212 to outlet port 214, cooling module 350 may include first cooling zone 361 (R1), second cooling zone 362 (R2), and third cooling zone 363 (R3).

First cooling zone 361 may include first cooling fins 351 with a first cooling fin geometry. Second cooling zone 362 may include second cooling fins 352 with a second cooling fin geometry. Third cooling zone 363 may include a third cooling fins 353 with a third cooling fin geometry. The first cooling fin geometry may be a sinusoidal wave having a first uniform wavelength. The second cooling fin geometry may be a sinusoidal wave having a second uniform wavelength that is shorter than (more waviness) the first uniform wavelength. The third cooling fin geometry may be a sinusoidal wave having a third uniform wavelength that is shorter than (more waviness) the second uniform wavelength.

One or more embodiments may provide a cooling module 350 including a progressive fin design, where the uniform wavelength of sinusoidal waves of the cooling fin geometry of the cooling fins in a particular cooling zone may decrease along a flow direction from inlet port 212. For example, first cooling zone 361 closest to inlet port 212 may include first cooling fins 351 with a longest uniform wavelength among the uniform wavelengths of the cooling zones. Third cooling zone 363 furthest from inlet port 212 may include third cooling fins 353 with a shortest uniform wavelength among the uniform wavelengths of the cooling zones. This progressive fin design may provide a reduce a pressure drop in traction inverter 102 and may result in parasitic loss reduction of heat sink system 300.

Figure 4:
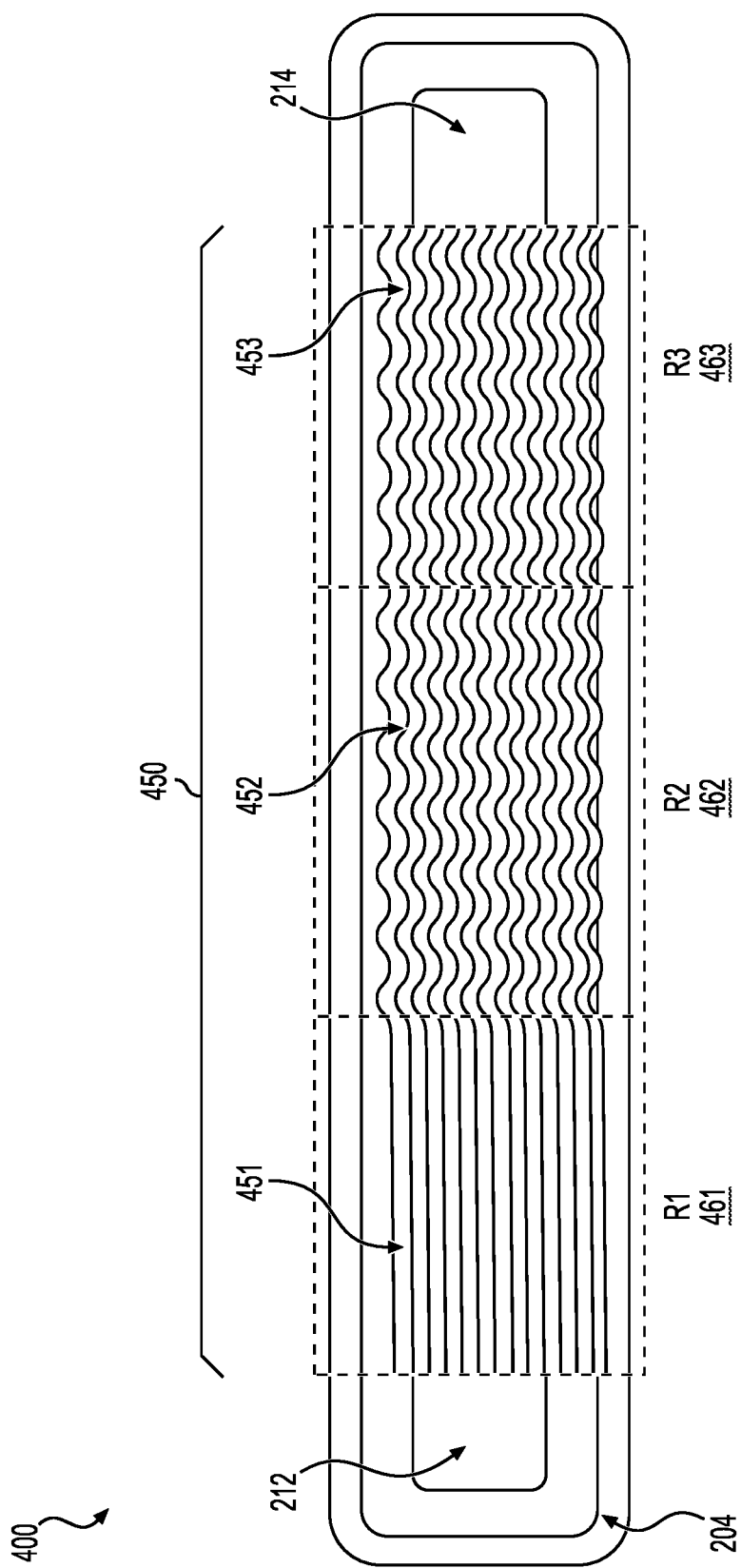
FIG. 4 depicts an exemplary heat sink system including a cooling module with cooling fins, according to one or more embodiments.

First cooling fins 351, second cooling fins 352, and third cooling fins 353 may differ from one another in one or more of number, thickness, height in a direction transverse to coolant flow, length in a direction of coolant flow, pitch, spacing, or material composition. For example, first cooling fins 351 in first cooling zone 361 may be composed of copper, while second cooling fins 352 of second cooling zone 362 may be composed of aluminum. Each of first cooling fins 351, second cooling fins 352, and third cooling fins 353 may be composed of one or more materials. For example, first cooling fins 351 may include a first portion composed of copper and a second portion composed of aluminum, or a combination of aluminum and copper. Although FIG. 4 depicts a cooling module 350 with three cooling zones (e.g., first cooling zone 361, second cooling zone 362, and third cooling zone 363), cooling module 350 may include two or more cooling zones. For example, cooling module may include ten cooling zones.

First cooling fins 351, second cooling fins 352, and third cooling fins 353 may be connected in a continuous manner. For example, a downstream end of first cooling fins 351 in first cooling zone 361 may connect to an upstream end of second cooling fins 352 in second cooling zone 362. A downstream end of second cooling fins 352 in second cooling zone 362 may connect to an upstream end of third cooling fins 353 in third cooling zone 363. First cooling fins 351, second cooling fins 352, and third cooling fins 353 may be regions of a continuous, single-folded, metal sheet with differing characteristics for each region.

FIG. 4 depicts an exemplary heat sink system including a cooling module with cooling fins, according to one or more embodiments. Heat sink system 400 may include a cooling module 450 and container 204. Although not shown in FIG. 4, heat sink system 400 may include housing 202 (see FIG. 2). Container 204 may include inlet port 212 and outlet port

214. Cooling module 450 may include a plurality of cooling zones R1, R2, and R3. Along a flow direction from inlet port 212 to outlet port 214, cooling module 450 may include first cooling zone 461 (R1), second cooling zone 462 (R2), and third cooling zone 463 (R3).

First cooling zone 461 may include first cooling fins 451 with a first cooling fin geometry. Second cooling zone 462 may include second cooling fins 452 with a second cooling fin geometry. Third cooling zone 463 may include a third cooling fins 453 with a third cooling fin geometry. The first cooling fin geometry may be a flat wave having a first uniform wavelength (corresponding to an infinite wavelength). The second cooling fin geometry may be a sinusoidal wave having a second uniform wavelength that is shorter than (more waviness) the first uniform wavelength. The third cooling fin geometry may be a sinusoidal wave having a third uniform wavelength that is shorter than (more waviness) the second uniform wavelength.

One or more embodiments may provide a cooling module 450 including a progressive fin design, where the uniform wavelength of sinusoidal waves of the cooling fin geometry of the cooling fins in a particular cooling zone may decrease along a flow direction from inlet port 212. For example, first cooling zone 461 closest to inlet port 212 may include first cooling fins 451 with a longest uniform wavelength (corresponding to an infinite wavelength) among the uniform wavelengths of the cooling zones. Third cooling zone 463 furthest from inlet port 212 may include third cooling fins 453 with a shortest uniform wavelength among the uniform wavelengths of the cooling zones. This progressive fin design may provide a uniform temperature distribution for power module 112. The progressive fin design may reduce a pressure drop in traction inverter 102 and may result in parasitic loss reduction of heat sink system 400.

First cooling fins 451, second cooling fins 452, and third cooling fins 453 may differ from one another in one or more of number, thickness, height in a direction transverse to coolant flow, length in a direction of coolant flow, pitch, spacing, or material composition. For example, first cooling fins 451 in first cooling zone 461 may be composed of copper, while second cooling fins 452 of second cooling zone 462 may be composed of aluminum. Each of first cooling fins 451, second cooling fins 452, and third cooling fins 453 may be composed of one or more materials. For example, first cooling fins 451 may include a first portion composed of copper and a second portion composed of aluminum, or a combination of aluminum and copper. Although FIG. 4 depicts a cooling module 450 with three cooling zones (e.g., first cooling zone 461, second cooling zone 462, and third cooling zone 463), cooling module 450 may include two or more cooling zones. For example, cooling module may include ten cooling zones.

First cooling fins 451, second cooling fins 452, and third cooling fins 453 may be connected in a continuous manner. For example, a downstream end of first cooling fins 451 in first cooling zone 461 may connect to an upstream end of second cooling fins 452 in second cooling zone 462. A downstream end of second cooling fins 452 in second cooling zone 462 may connect to an upstream end of third cooling fins 453 in third cooling zone 463.

First cooling fins 451 may be inclined relative to a general direction of flow of coolant from the inlet port 212 to outlet port 214. For example, first cooling fins may be inclined at an angle from approximately 0 degrees to approximately 45 degrees relative to a longitudinal axis of cooling module 450.

Figure 5:
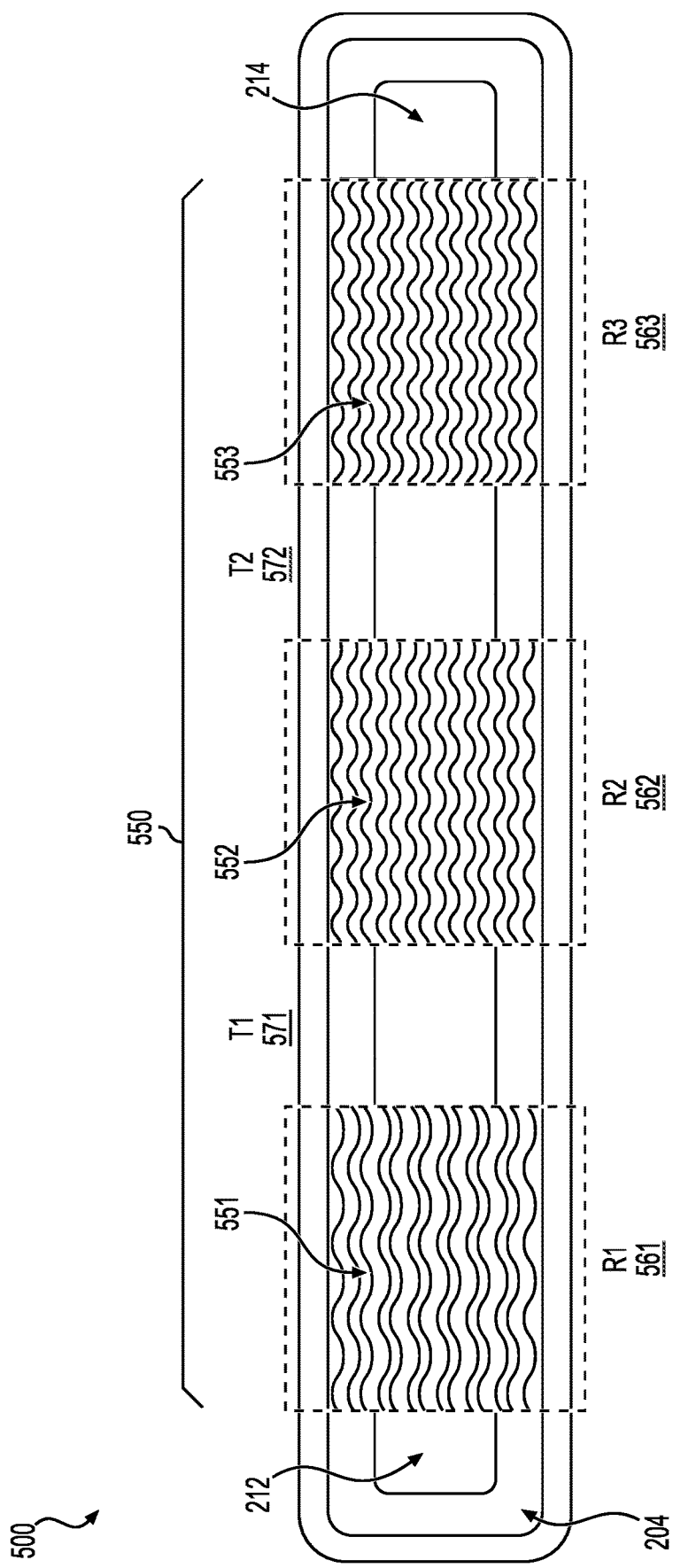
FIG. 5 depicts an exemplary heat sink system including a cooling module with cooling fins and transition regions without fins, according to one or more embodiments.

FIG. 5 depicts an exemplary heat sink system including a cooling module with cooling fins and transition regions without fins, according to one or more embodiments. Heat sink system 500 may include a cooling module 550 and container 204. Although not shown in FIG. 5, heat sink system 500 may include housing 202 (see FIG. 2). Container 204 may include inlet port 212 and outlet port 214. Cooling module 550 may include a plurality of cooling zones R1, R2, and R3. Along a flow direction from inlet port 212 to outlet port 214, cooling module 550 may include first cooling zone 561 (R1), second cooling zone 562 (R2), and third cooling zone 563 (R3).

First cooling zone 561 may include first cooling fins 551 with a first cooling fin geometry. Second cooling zone 562 may include second cooling fins 552 with a second cooling fin geometry. Third cooling zone 563 may include a third cooling fins 553 with a third cooling fin geometry. The first cooling fin geometry may be a sinusoidal wave having a first uniform wavelength. The second cooling fin geometry may be a sinusoidal wave having a second uniform wavelength that is shorter than (more waviness) the first uniform wavelength. The third cooling fin geometry may be a sinusoidal wave having a third uniform wavelength that is shorter than (more waviness) the second uniform wavelength.

One or more embodiments may provide a cooling module 550 including a progressive fin design, where the uniform wavelength of sinusoidal waves of the cooling fin geometry of the cooling fins in a particular cooling zone may decrease along a flow direction from inlet port 212. For example, first cooling zone 561 closest to inlet port 212 may include first cooling fins 551 with a longest uniform wavelength among the uniform wavelengths of the cooling zones. Third cooling zone 563 furthest from inlet port 212 may include third cooling fins 553 with a shortest uniform wavelength among the uniform wavelengths of the cooling zones. This progressive fin design may provide a uniform temperature distribution for power module 112. The progressive fin design may reduce a pressure drop in traction inverter 102 and may result in parasitic loss reduction of heat sink system 500.

First cooling fins 551, second cooling fins 552, and third cooling fins 553 may differ from one another in one or more of number, thickness, height in a direction transverse to coolant flow (i.e. an "amplitude" of waviness of the cooling fin), length in a direction of coolant flow, pitch, spacing, or material composition. For example, first cooling fins 551 in first cooling zone 561 may be composed of copper, while second cooling fins 552 of second cooling zone 562 may be composed of aluminum. Each of first cooling fins 551, second cooling fins 552, and third cooling fins 553 may be composed of one or more materials. For example, first cooling fins 551 may include a first portion composed of copper and a second portion composed of aluminum, or a combination of aluminum and copper. Although FIG. 5 depicts a cooling module 550 with three cooling zones (e.g., first cooling zone 561, second cooling zone 562, and third cooling zone 563), cooling module 550 may include two or more cooling zones. For example, cooling module may include ten cooling zones.

First cooling fins 551, second cooling fins 552, and third cooling fins 553 may be separated by first transition zone 571 (T1) and second transition zone 572 (T2). For example, a downstream end of first cooling fins 551 in first cooling zone 561 may connect to an upstream end of first transition zone 571. A downstream end of first transition zone 571 may connect to an upstream end of second cooling fins 552 in second cooling zone 562. A downstream end of second cooling fins 552 in second cooling zone 562 may connect to an upstream end of second transition zone 572. A downstream end of second transition zone 572 may connect to an upstream end of third cooling fins 553 in third cooling zone 563. First transition zone 571 and second transition zone 572 may be zones without cooling fins in cooling module 550.

Figure 6:
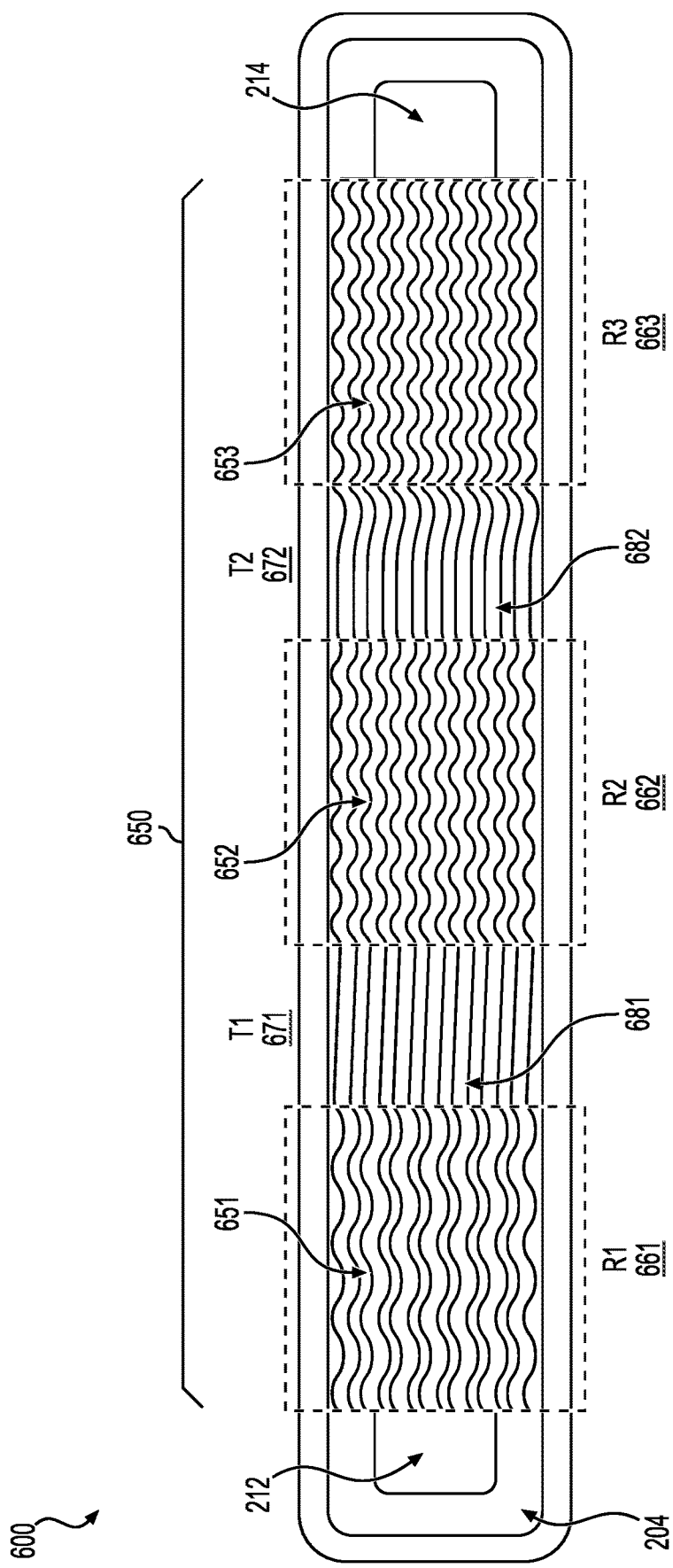
FIG. 6 depicts an exemplary heat sink system including a cooling module with cooling fins and transition regions including cooling fins, according to one or more embodiments.

FIG. 6 depicts an exemplary heat sink system including a cooling module with cooling fins and transition regions including cooling fins, according to one or more embodiments. Heat sink system 600 may include a cooling module 650 and container 204. Although not shown in FIG. 6, heat sink system 600 may include housing 202 (see FIG. 2). Container 204 may include inlet port 212 and outlet port 214. Cooling module 650 may include a plurality of cooling zones R1, R2, and R3. Along a flow direction from inlet port 212 to outlet port 214, cooling module 650 may include first cooling zone 661 (R1), second cooling zone 662 (R2), and third cooling zone 663 (R3).

First cooling zone 661 may include first cooling fins 651 with a first cooling fin geometry. Second cooling zone 662 may include second cooling fins 652 with a second cooling fin geometry. Third cooling zone 663 may include a third cooling fins 653 with a third cooling fin geometry. The first cooling fin geometry may be a sinusoidal wave having a first uniform wavelength. The second cooling fin geometry may be a sinusoidal wave having a second uniform wavelength that is shorter than (more waviness) the first uniform wavelength. The third cooling fin geometry may be a sinusoidal wave having a third uniform wavelength that is shorter than (more waviness) the second uniform wavelength.

One or more embodiments may provide a cooling module 650 including a progressive fin design, where the uniform wavelength of sinusoidal waves of the cooling fin geometry of the cooling fins in a particular cooling zone may decrease along a flow direction from inlet port 212. For example, first cooling zone 661 closest to inlet port 212 may include first cooling fins 651 with a longest uniform wavelength among the uniform wavelengths of the cooling zones. Third cooling zone 663 furthest from inlet port 212 may include third cooling fins 653 with a shortest uniform wavelength among the uniform wavelengths of the cooling zones. This progressive fin design may provide a reduce a pressure drop in traction inverter 102 and may result in parasitic loss reduction of heat sink system 600.

First cooling fins 651, second cooling fins 652, and third cooling fins 653 may differ from one another in one or more of number, thickness, height in a direction transverse to coolant flow, length in a direction of coolant flow, pitch, spacing, or material composition. For example, first cooling fins 651 in first cooling zone 661 may be composed of copper, while second cooling fins 652 of second cooling zone 662 may be composed of aluminum. Each of first cooling fins 651, second cooling fins 652, and third cooling fins 653 may be composed of one or more materials. For example, first cooling fins 651 may include a first portion composed of copper and a second portion composed of aluminum, or a combination of aluminum and copper. Although FIG. 6 depicts a cooling module 650 with three cooling zones (e.g., first cooling zone 661, second cooling zone 662, and third cooling zone 663), cooling module 650 may include two or more cooling zones. For example, cooling module may include ten cooling zones.

First cooling fins 651, second cooling fins 652, and third cooling fins 653 may be separated by first transition zone 671 (T1) and second transition zone 672 (T2). First transition zone 671 may include first transition cooling fins 681 with a first transition cooling fin geometry. Second transition zone 672 may include second transition cooling fins 682 with a second transition cooling fin geometry. The first transition cooling fin geometry may be a flat wave having a first uniform wavelength (corresponding to an infinite wavelength). The second transition cooling fin geometry may be a flat wave having a second uniform wavelength (corresponding to an infinite wavelength). First transition cooling fins 681 may be inclined relative to a general direction of flow of coolant from the inlet port 212 to outlet port 214. For example, first transition cooling fins may be inclined at a first angle from approximately 5 degrees to approximately 45 degrees relative to a longitudinal axis of cooling module 650. Second transition cooling fins 682 may be inclined relative to a general direction of flow of coolant from the inlet port 212 to outlet port 214. For example, second transition cooling fins 682 may be inclined at a second angle from approximately 5 degrees to approximately 45 degrees relative to a longitudinal axis of cooling module 650. The second angle may be greater than, less than, or equal to the first angle. For example, first transition cooling fins 681 may be inclined at first angle of 8 degrees and second transition cooling fins 682 may be inclined at a second angle of 10 degrees, relative to a longitudinal axis of cooling module 650.

A downstream end of first cooling fins 651 in first cooling zone 661 may connect to an upstream end of first transition cooling fins 681 in first transition zone 671. A downstream end of first transition cooling fins 681 in first transition zone 671 may connect to an upstream end of second cooling fins 652 in second cooling zone 662. A downstream end of second cooling fins 652 in second cooling zone 662 may connect to an upstream end of second transition cooling fins 682 in second transition zone 672. A downstream end of second transition cooling fins 682 in second transition zone 672 may connect to an upstream end of third cooling fins 653 in third cooling zone 663.

Figure 7:
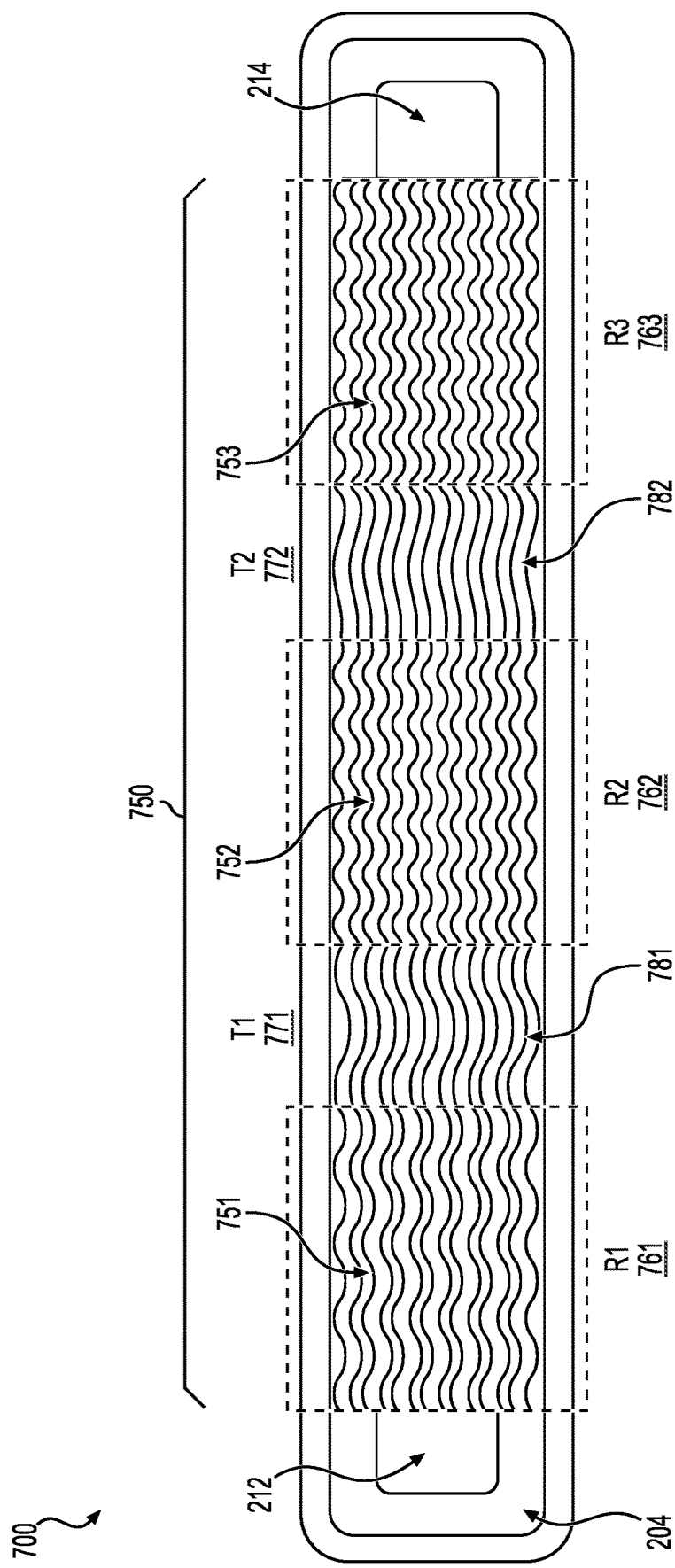
FIG. 7 depicts an exemplary heat sink system including a cooling module with cooling fins and transition regions including cooling fins, according to one or more embodiments.

FIG. 7 depicts an exemplary heat sink system including a cooling module with cooling fins and transition regions including cooling fins, according to one or more embodiments. Heat sink system 700 may include a cooling module 750 and container 204. Although not shown in FIG. 7, heat sink system 700 may include housing 202 (see FIG. 2). Container 204 may include inlet port 212 and outlet port 214. Cooling module 750 may include a plurality of cooling zones R1, R2, and R3. Along a flow direction from inlet port 212 to outlet port 214, cooling module 750 may include first cooling zone 761 (R1), second cooling zone 762 (R2), and third cooling zone 763 (R3).

First cooling zone 761 may include first cooling fins 751 with a first cooling fin geometry. Second cooling zone 762 may include second cooling fins 752 with a second cooling fin geometry. Third cooling zone 763 may include a third cooling fins 753 with a third cooling fin geometry. The first cooling fin geometry may be a sinusoidal wave having a first uniform wavelength. The second cooling fin geometry may be a sinusoidal wave having a second uniform wavelength that is shorter than (more waviness) the first uniform wavelength. The third cooling fin geometry may be a sinusoidal wave having a third uniform wavelength that is shorter than (more waviness) the second uniform wavelength.

One or more embodiments may provide a cooling module 750 including a progressive fin design, where the uniform wavelength of sinusoidal waves of the cooling fin geometry of the cooling fins in a particular cooling zone may decrease along a flow direction from inlet port 212. For example, first cooling zone 761 closest to inlet port 212 may include first cooling fins 751 with a longest uniform wavelength among the uniform wavelengths of the cooling zones. Third cooling zone 763 furthest from inlet port 212 may include third cooling fins 753 with a shortest uniform wavelength among the uniform wavelengths of the cooling zones. This progressive fin design may provide a uniform temperature distribution for power module 112. The progressive fin design may reduce a pressure drop in traction inverter 102 and may result in parasitic loss reduction of heat sink system 700.

First cooling fins 751, second cooling fins 752, and third cooling fins 753 may differ from one another in one or more of number, thickness, height in a direction transverse to coolant flow, length in a direction of coolant flow, pitch, spacing, or material composition. For example, first cooling fins 751 in first cooling zone 761 may be composed of copper, while second cooling fins 752 of second cooling zone 762 may be composed of aluminum. Each of first cooling fins 751, second cooling fins 752, and third cooling fins 753 may be composed of one or more materials. For example, first cooling fins 751 may include a first portion composed of copper and a second portion composed of aluminum, or a combination of aluminum and copper. Although FIG. 7 depicts a cooling module 750 with three cooling zones (e.g., first cooling zone 761, second cooling zone 762, and third cooling zone 763), cooling module 750 may include two or more cooling zones. For example, cooling module may include ten cooling zones.

First cooling fins 751, second cooling fins 752, and third cooling fins 753 may be separated by first transition zone 771 (T1) and second transition zone 772 (T2). First transition zone 771 may include first transition cooling fins 781 with a first transition cooling fin geometry. Second transition zone 772 may include second transition cooling fins 782 with a second transition cooling fin geometry. The first transition cooling fin geometry may be a flat wave having a first uniform wavelength (corresponding to an infinite wavelength). First cooling fins 751 may be inclined relative to a general direction of flow of coolant from the inlet port 212 to outlet port 214. The first transition cooling fin geometry may be a sinusoidal wave having a first uniform wavelength. The second transition cooling fin geometry may be a sinusoidal wave having a second uniform wavelength. The second transition cooling fin geometry may be a sinusoidal wave having a second uniform wavelength that is delayed, or inverted, from the first uniform wavelength. For example, as shown in FIG. 7, the first uniform wavelength may generally be a negative portion of a sinusoidal wave, and the second uniform wavelength may generally be a positive portion of a sinusoidal wave.

A downstream end of first cooling fins 751 in first cooling zone 761 may connect to an upstream end of first transition cooling fins 781 in first transition zone 771. A downstream end of first transition cooling fins 781 in first transition zone 771 may connect to an upstream end of second cooling fins 752 in second cooling zone 762. A downstream end of second cooling fins 752 in second cooling zone 762 may connect to an upstream end of second transition cooling fins 782 in second transition zone 772. A downstream end of second transition cooling fins 782 in second transition zone 772 may connect to an upstream end of third cooling fins 753 in third cooling zone 763.

One or more embodiments may include progressive fins which may have progressively changing wavelength (waviness) of the fins in a flow direction of coolant. One or more embodiments may reduce pressure drop in an inverter, which may result in a parasitic loss reduction of a cooling system. One or more embodiments may reduce the temperature of a power module, which may result in a higher performance or power density of the inverter, or a longer driving range of an electric vehicle. One or more embodiments may include progressive cooling fins that may provide uniform temperature among power modules, which may improve the performance and reliability of an electric vehicle.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
an inverter configured to convert DC power from a battery to AC power to drive a motor, wherein the inverter includes:
a power module; and
a heat sink system configured to cool the power module, the heat sink system including:
a container including a cavity;
a housing connecting to the container to cover the cavity, wherein one or more of the container or the housing includes an inlet port, and one or more of the container or the housing includes an outlet port; and
a cooling module in the cavity between the container and the housing, the cooling module in a flow of coolant from the inlet port to the outlet port, wherein the cooling module includes:
first cooling fins with a first cooling fin geometry,
second cooling fins with a second cooling fin geometry,
a first transition zone with first transition cooling fins with a first transition cooling fin geometry, wherein the first transition cooling fin geometry is a flat wave inclined at an angle, and
a second transition zone, wherein the first cooling fins are upstream of the second cooling fins along the flow of coolant from the inlet port to the outlet port, wherein the first transition cooling fins connect and are between the first cooling fins and the second cooling fins, and the second transition zone is downstream from the second cooling fins along the flow of coolant from the inlet port to the outlet port, wherein the second transition zone includes second transition cooling fins with a second transition cooling fin geometry, wherein the second transition cooling fin geometry is a sinusoidal wave having a uniform wavelength that is shorter than a wavelength of the flat wave.

2. The system of claim 1, wherein the first cooling fin geometry is a first sinusoidal wave having a first uniform wavelength, and the second cooling fin geometry is a second sinusoidal wave having a second uniform wavelength that is shorter than the first uniform wavelength.

3. The system of claim 1, further comprising:
the battery configured to supply the DC power to the inverter; and
the motor configured to receive the AC power from the inverter to drive the motor.

4. A heat sink system comprising:
a container including a cavity;
a housing connecting to the container to cover the cavity, wherein one or more of the container or the housing includes an inlet port, and one or more of the container or the housing includes an outlet port; and a cooling module in the cavity between the container and the housing, the cooling module in a flow of coolant from the inlet port to the outlet port, wherein the cooling module includes:
 first cooling fins with a first cooling fin geometry,
 second cooling fins with a second cooling fin geometry,
 a first transition zone with first transition cooling fins with a first transition cooling fin geometry between and connecting the first cooling fins and the second cooling fins, wherein the first cooling fins are upstream of the second cooling fins along the flow of coolant from the inlet port to the outlet port, wherein the first transition cooling fin geometry is a flat wave inclined at an angle,
 third cooling fins with a third cooling fin geometry, wherein the second cooling fins are upstream of the third cooling fins along the flow of coolant from the inlet port to the outlet port, and
 a second transition zone between the second cooling fins and the third cooling fins, wherein the second transition zone includes second transition cooling fins with a second transition cooling fin geometry, wherein the second transition cooling fin geometry is a sinusoidal wave having a uniform wavelength that is shorter than a wavelength of the flat wave.

5. The heat sink system of claim 4, wherein the first cooling fin geometry is a first sinusoidal wave having a first uniform wavelength, and the second cooling fin geometry is a second sinusoidal wave having a second uniform wavelength that is shorter than the first uniform wavelength.

6. The heat sink system of claim 5, wherein:
 the third cooling fin geometry is a third sinusoidal wave having a third uniform wavelength that is shorter than the second uniform wavelength.

7. The heat sink system of claim 4, wherein a downstream end of the first cooling fins is connected to an upstream end of the second cooling fins.

8. The heat sink system of claim 4, wherein:
 a downstream end of the first cooling fins is connected to an upstream end of the first transition cooling fins, and
 a downstream end of the first transition cooling fins is connected to an upstream end of the second cooling fins.

9. An inverter comprising the heat sink system of claim 4.

10. A vehicle comprising the inverter of claim 9.

11. A cooling module comprising:
 first cooling fins with a first cooling fin geometry,
 second cooling fins with a second cooling fin geometry,
 a first transition zone with first transition cooling fins with a first transition cooling fin geometry between and connecting the first cooling fins and the second cooling fins, wherein the first cooling fin geometry is a first sinusoidal wave having a first uniform wavelength, and the second cooling fin geometry is a second sinusoidal wave having a second uniform wavelength that is shorter than the first uniform wavelength, wherein the first transition cooling fin geometry is a flat wave inclined at an angle,
 third cooling fins with a third cooling fin geometry, wherein the second cooling fins are upstream of the third cooling fins along a flow of coolant from an inlet port to an outlet port, and
 a second transition zone between the second cooling fins and the third cooling fins, wherein the second transition zone includes second transition cooling fins with a second transition cooling fin geometry, wherein the second transition cooling fin geometry is a sinusoidal wave having a uniform wavelength that is shorter than a wavelength of the flat wave.

12. The cooling module of claim 11, wherein:
 the third cooling fin geometry is a third sinusoidal wave having a third uniform wavelength that is shorter than the second uniform wavelength.

13. The cooling module of claim 11, wherein an end of the first cooling fins is connected to an end of the second cooling fins.

14. The cooling module of claim 11, wherein the first transition cooling fin geometry is inclined at an angle from approximately 5 degrees to approximately 45 degrees relative to a longitudinal axis of the cooling module.

* * * * *